United States Patent [19]

Barrett, Jr. et al.

[11] Patent Number: 5,412,336
[45] Date of Patent: May 2, 1995

[54] SELF-BIASING BOOT-STRAPPED CASCODE AMPLIFIER

[75] Inventors: Raymond L. Barrett, Jr., Ft. Lauderdale; Barry W. Herold, Boca Raton; Grazyna A. Pajunen, Delray Beach, all of Fla.

[73] Assignee: Motorola, Inc., Schaumburg, Ill.

[21] Appl. No.: 150,660

[22] Filed: Nov. 10, 1993

[51] Int. Cl.⁶ ............................................. H03F 3/68
[52] U.S. Cl. .................................. 327/560; 327/561; 327/545; 330/288; 330/310
[58] Field of Search ............... 307/496, 494, 497, 584, 307/585, 501, 296.4, 296.5, 362, 363; 330/310, 288, 252, 253; 327/560, 561, 563, 437, 484, 65, 427, 434, 581, 545, 143, 546, 77, 80

[56] References Cited

U.S. PATENT DOCUMENTS

| | | | |
|---|---|---|---|
| 4,433,305 | 2/1984 | Ozawa et al. | 33 D/310 |
| 4,568,844 | 2/1986 | O'Connor | 307/584 |
| 4,714,840 | 12/1987 | Proebsting | 307/584 |
| 4,825,018 | 4/1989 | Okada et al. | 307/362 |
| 5,057,722 | 10/1991 | Kobatake | 307/585 |
| 5,162,680 | 11/1992 | Norman et al. | 307/362 |
| 5,177,374 | 1/1993 | Carpenter et al. | 307/350 |
| 5,245,222 | 9/1993 | Carobolante | 330/288 |

Primary Examiner—Timothy P. Callahan
Assistant Examiner—T. Lam
Attorney, Agent, or Firm—Gregg E. Rasor

[57] ABSTRACT

A cascode amplifier circuit including an input mirroring transistor (401) that generates a first output current (403) in response to the input signal. A diode connected transistor (404) generates a control bias proportional to the first output current. A cascode connected transistor output stage (405) includes a common source transistor (406) coupled to the input signal and the input mirroring transistor (401) for establishing an output current (407) in the cascode connected transistor output stage. A common gate transistor (408) is coupled to the diode connected transistor (404) and the common source transistor (406) for isolating the common source transistor (406) from any change in an output voltage present at an output terminal (409) of the common gate transistor (408) while operating to control the output currently(407) in response to the control bias.

11 Claims, 4 Drawing Sheets

SELF-BIASING BOOT-STRAPPED CASCODE AMPLIFIER

FIELD OF THE INVENTION

This invention relates in general to a transistorized electronic amplifier and more particularly to a self-biasing boot-strapped cascode amplifier for use in a radio frequency communication device.

BACKGROUND OF THE INVENTION

In portable battery operated products such as a radio frequency communication device, it is desirable to have the lowest possible overall current drain in order to maximize battery life. Moreover, it is desirable to operate such products at the lowest possible voltage so as to minimize their total power consumption.

Conventional radio frequency communication devices may use one or more application specific integrated circuits to implement functions such as phase lock loops to synthesize frequencies needed for digital logic or radio frequency circuits. To conserve power, a synthesizer or other circuitry implemented in an application specific integrated circuit should be operated using as low a voltage as possible. Moreover, to conserve even more power, these circuits may be operated in a power saving mode where one or more of the circuits are switched on during active processing periods (e.g., signal transmission or reception, data storage, retrieval, or presentation) and off during "sleep" or "rest" periods. Operating in this fashion, a portable battery operated product can substantially increase available battery life, thus resulting in more usable "talk time" in a radio frequency communication device such as a cellular telephone or the like.

In the past, low voltage circuitry implemented in application specific integrated circuits typically consisted of bipolar analog or I²L (integrated injection logic) logic circuits. These bipolar circuits experienced problems such as poor high speed operation (I²L operating at 0.25 μA per gate is typically operational to only around 50 KHz), a lack of dynamic range (conventional low bipolar analog circuits have a saturation point of typically 200 mY, yielding a range of less than 600 mY from a one volt supply), and extreme variation of their intrinsic operating characteristics over temperature.

Thus, what is needed is low voltage CMOS (complimentary metal oxide semiconductor) process and appropriate circuit topologies that allow a designer to achieve both analog and digital functions using an application specific integrated circuit in a radio frequency communication device. As such, the low voltage CMOS designs would operate at significantly lower power levels than comparable bipolar designs. Moreover, when operated in a power saving mode, the CMOS designs can more effectively conserve power while offering improved circuit performance characteristics.

SUMMARY OF THE INVENTION

Briefly, according to the invention, there is provided a cascode amplifier circuit comprising: an input mirroring transistor having a control node coupled to an input signal, the input mirroring transistor generating a first output current in response to the input signal; a diode connected transistor that generates a control bias proportional to the first output current; and a cascode connected transistor output stage coupled to the input mirroring transistor and the diode connected transistor, the cascode connected transistor output stage comprising: a common source transistor coupled to the input signal and the input mirroring transistor for establishing an output operating current in the cascode connected transistor output stage; and a common gate transistor coupled to the diode connected transistor and the common source transistor for isolating the common source transistor from any change in an output voltage present at an output terminal of the common gate transistor while operating to control an output current conducted by the common gate transistor in response to the control bias.

DESCRIPTION OF A PREFERRED EMBODIMENT

Figure 1:
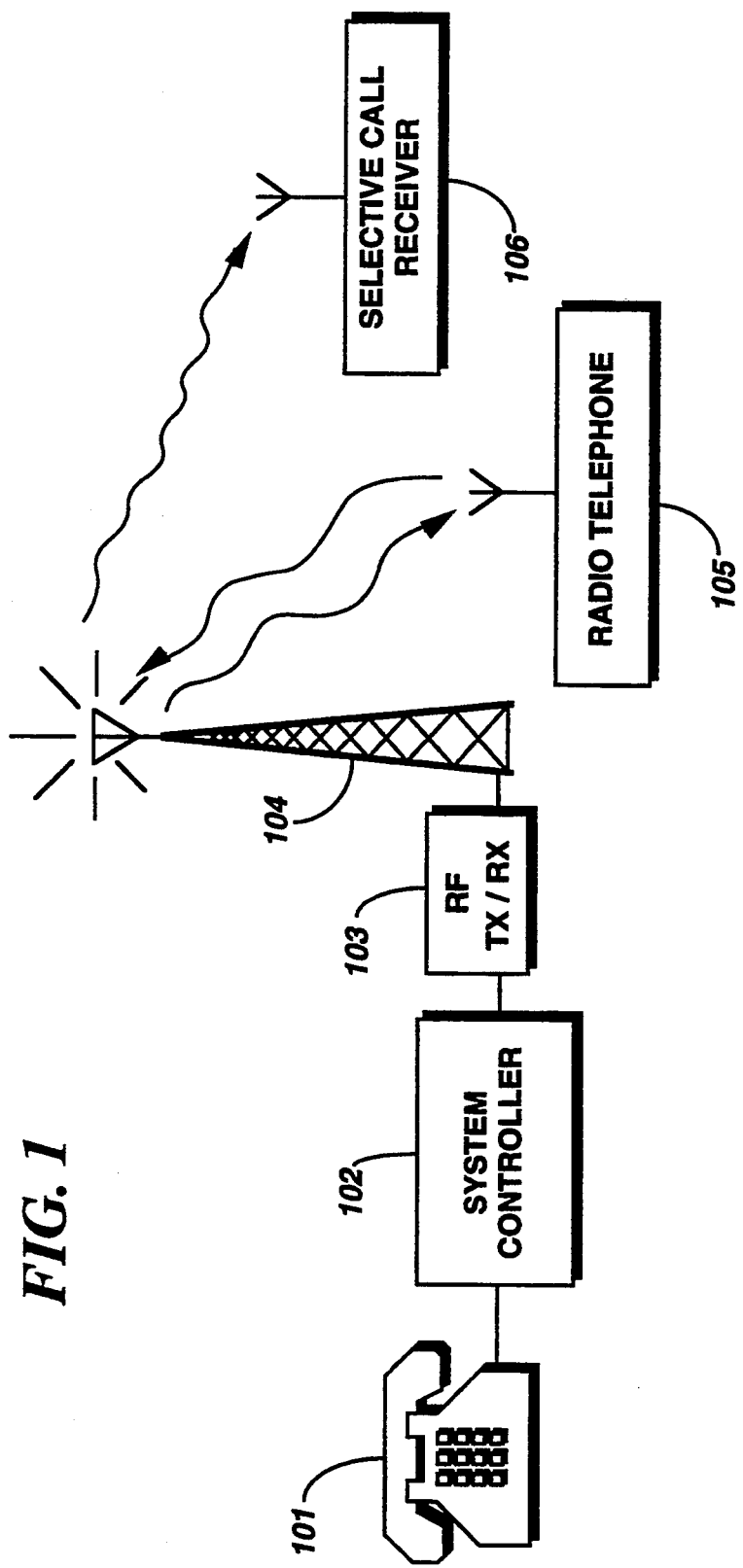
FIG. 1 is a block diagram of a radio frequency communication system suitable for use with the present invention.

Referring to FIG. 1, the preferred embodiment of a radio communication system comprises a telephone 101 connected by a conventional public switched telephone network (PSTN) to a system controller 102 which may oversee operation of the radio frequency transmitter/receiver 103 and encodes and decodes the inbound and outbound addresses into formats that are compatible the respective land line and cellular radio telephone addressing requirements. The system controller 102 can also function to encode paging messages for transmission by the radio frequency transmitter/receiver 103. Telephony signals are transmitted to and received from a radio telephone 105 by at least one antenna 104 coupled to the radio frequency transmitter/receiver 103. The radio frequency transmitter/receiver 103 may also be used to transmit paging messages to an optional selective call receiver 106.

It should be noted that the system controller 102 is capable of operating in a distributed transmission control environment that allows mixing cellular, simulcast, master/slave, or any conventional wide and local area coverage scheme. Moreover, as one of ordinary skill in the art would recognize, the telephonic and paging functions may reside in separate system controllers that may operate either independently or in a networked fashion.

Figure 2:
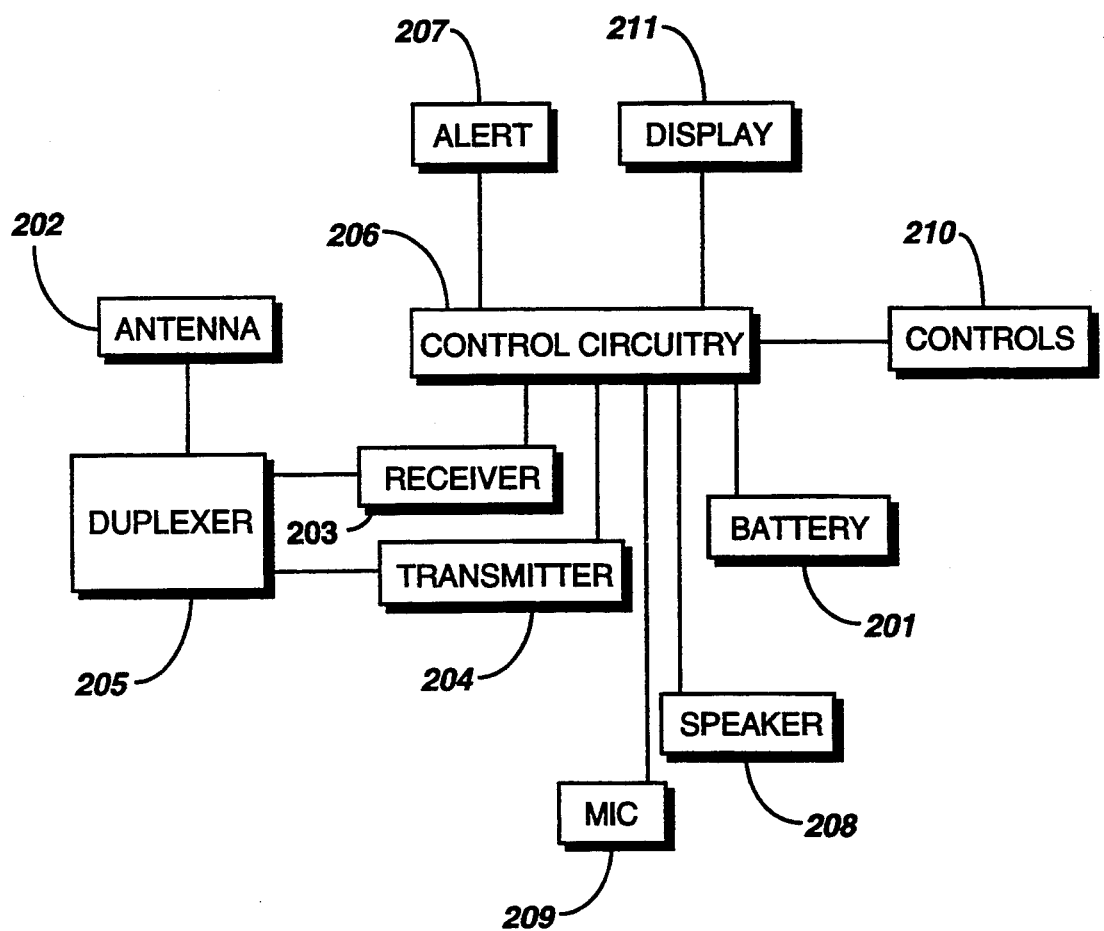
FIG. 2 is a block diagram of a radio telephone depicted in FIG. 1 system suitable for use with the present invention.

Referring to FIG. 2, a block diagram is shown of a battery 201 powered radio telephone. A radio frequency signal is received and/or transmitted by an antenna 202. The antenna is coupled to a receiver 203 and a transmitter 204 by a duplexer 205. The received signal is coupled from the receiver 203 to the control circuitry 206 for recovering any information contained within the received signal. This recovered information is then used to activate an alert 207 (a ringer in the case of a cellular radio telephone), and after answering the call, to sustain a telephone connection. When the telephone connection is completed, the user may audibly communicate with another party via a speaker 208 and a microphone 209. The control circuitry 206 routes recovered audio to the speaker 208 which converts electrical energy into acoustical energy thus enabling the user to hear any communications. The microphone 209 is used to convert acoustic energy into electrical energy for use by the control circuitry 206 in modulating the radio frequency carrier produced by the transmitter 204.

The user may initiate a call by selecting the proper control 210 and entering a number of a party to be contacted. When entering and sending, the number may be presented on a display 211 to provide the user with visual feedback confirming the number entered and subsequently sent.

Figure 3:
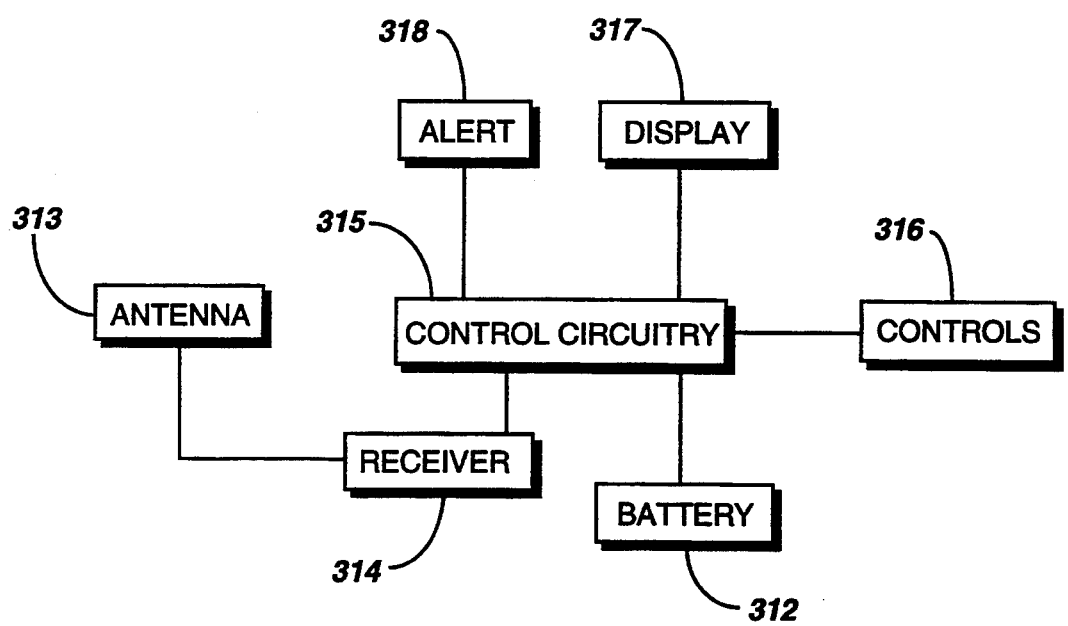
FIG. 3 is a block diagram of a selective call receiver depicted in FIG. 1 system suitable for use with the present invention.

Referring to FIG. 3, a block diagram is shown of a battery 312 powered selective call receiver. The selective call receiver operates to receive a signal via an antenna 313. The received signal is routed from the antenna 313 to the receiver 314. The receiver 314 operates to demodulate the received signal using conventional techniques and forwards a demodulated signal to the control circuitry 315, which decodes and recovers information contained within the received signal. In accordance with the recovered information and user controls 316, the selective call receiver may present at least a portion of the information, such as by a display 317, and may signal the user via a sensible alert 318 that a message has been received.

In the preferred embodiments of both the radio telephone and the selective call receiver, the associated control circuitry 206, 315 may comprise a number of active function circuits that use cascode amplifier circuits to implement command and control functions associated with the radio frequency communication device. By example, the active function circuits may be included in large scale devices such as a microprocessor or application specific integrated circuit for enabling functions such as a signal processor (e.g., a decoder), a conventional signal multiplexer, a voltage regulator that may supply a regulated voltage to other portions of the radio. Alternatively, the associated control circuitry 206, 315 may include active function circuits such as A/D and D/A converters, programmable I/O ports, a control buss, environmental sensing circuitry such as for light or temperature conditions, audio power amplifier circuitry, control interface circuitry, a clock or local oscillator frequency synthesizer, and display illumination circuitry. These elements are typically conventionally assembled to provide the marketable features comprising the radio telephone or selective call receiver requested by a customer.

Figure 4:
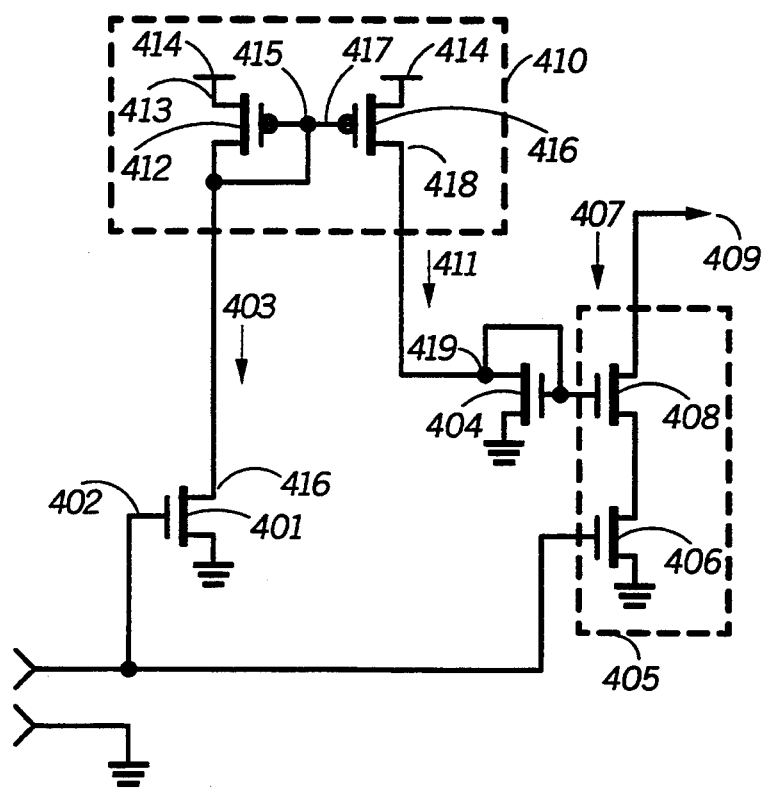
FIG. 4 is a schematic diagram of a cascode amplifier circuit in accordance with the preferred embodiment of the present invention.

Referring to FIG. 4, a schematic diagram illustrates a cascode amplifier circuit in accordance with the preferred embodiment of the present invention.

A cascode amplifier circuit comprises an input mirroring transistor 401 with a control node 402 coupled to an input signal, the input mirroring transistor 401 generating a first output current 403 in response to the input signal. A diode connected transistor 404 generates a control bias proportional to the first output current 411. A cascode connected transistor output stage 405 is coupled to the input mirroring transistor 401 and the diode connected transistor 404. The cascode connected transistor output stage 405 comprises a common source transistor 406 coupled to the input signal and the input mirroring transistor 401 for establishing an output current 407 in the cascode connected transistor output stage 405. A common gate transistor 408 is coupled to the diode connected transistor 404 and the common source transistor 406 for isolating the common source transistor 406 from any change in an output voltage present at an output terminal 409 of the common gate transistor 408 while operating to control the output current 407 conducted by the common gate transistor 408 in response to the control bias.

The cascode amplifier circuit further comprises a current mirror 410 coupled to the input mirroring transistor 401. The current mirror 410 operates to generate a second output current 411 that is proportional to the first output current 403. The second output current 411 is coupled to the diode connected transistor 404 for generating the control bias that establishes the output current 407 in the cascode connected transistor output stage 405.

The current mirror 410 includes a diode connected mirror transistor 412 with a bias node 413 coupled to a voltage bias 414 and a diode connected node 415 coupled to a conduction node 416 of the input mirroring transistor 401. The diode connected mirror transistor 412 operates at the first output current 403 A current mirroring transistor 416 has a control node 417 coupled to the diode connected node 415 of the diode connected mirror transistor 412 and a conduction node 418 coupled to a diode connected node 419 of the diode connected transistor 404. The current mirroring transistor 416 operates to conduct the second output current 411 between the voltage bias 414 and the diode connected node 419 of the diode connected transistor 404 at a magnitude determined at least in part by a ratio of effective device geometries between the diode connected mirror transistor 412 and the current mirroring transistor 416.

In the cascode amplifier circuit discussed above, the ratio of effective device geometries between the diode connected mirror transistor 412 and the current mirroring transistor 416 controls a current gain realized between the first mirror current and the second output current. This may be used to achieve a programmable current gain between the input and output currents.

In accordance with the preferred embodiment of the present invention, the cascode amplifier circuit discussed in reference to FIG. 4 is part of at least one active function circuit included in the control circuit for the radio frequency communication device. As can be appreciated by one of ordinary skill in the art, this invention can be realized in a number of embodiments of which the disclosed embodiment is only one of many equivalent alternatives. Low voltage CMOS (complimentary metal oxide semiconductor) designs operate at significantly lower power levels than conventional bipolar designs, and when operated in a power saving mode, the CMOS designs can more effectively conserve power while offering improved circuit performance characteristics.

What is claimed is:

1. A cascode amplifier circuit comprising:
an input mirroring transistor having a control node coupled to an input signal, the input mirroring transistor generating a first output current in response to the input signal;
a current mirror coupled to the input mirroring transistor, the current mirror operating to generate a second output current that is proportional to the first output current, the second output current being coupled to a diode connected transistor for generating a control bias;

a cascode connected transistor output stage coupled to the input mirroring transistor and the diode connected, transistor, the cascode connected transistor output stage comprising:
  a common source transistor coupled to the input signal and the input mirroring transistor for establishing an output operating current in the cascode connected transistor output stage; and
  a common gate transistor coupled to the diode connected transistor and the common source transistor for isolating the common source transistor from any change in an output voltage present at an output terminal of the common gate transistor while operating to control an output current conducted by the common gate transistor in response to the control bias.

2. The cascode amplifier circuit according to claim 1 wherein the current mirror comprises:
  a diode connected mirror transistor having a bias node coupled to a voltage bias and a diode connected node coupled to a conduction node of the input mirroring transistor, the diode connected mirror transistor operating at the first output current; and
  a current mirroring transistor having a control node coupled to the diode connected node of the diode connected mirror transistor and a conduction node coupled to diode connected node of the diode connected transistor, the current mirroring transistor operating to conduct the second output current between the voltage bias and the diode connected node of the diode connected transistor at a magnitude determined at least in part by a ratio of effective device geometries between the diode connected mirror transistor and the current mirroring transistor.

3. The cascode amplifier circuit according to claim 2 wherein the ratio of effective device geometries between the diode connected mirror transistor and the current mirroring transistor controls a current gain realized between the first output current and the second output current.

4. The cascode amplifier circuit according to claim 1 wherein the cascode amplifier circuit is part of an active function circuit included in a control circuit for a radio frequency communication device.

5. A cascode amplifier circuit comprising:
  an input mirror transistor having a control node coupled to an input signal, the input mirroring transistor generating a first output current in response to the input signal;
  a current mirror coupled to the input mirroring transistor, the current mirror operating to generate a second output current that is proportional to the first output current;
  a diode connected transistor coupled to the current mirror for generating a control bias in response to the second output current and the first output current that is directly coupled from the input mirroring transistor; and
  a cascode connected transistor output stage coupled to the input mirroring transistor and the diode connected transistor, the cascode connected transistor output stage comprising:
  a common source transistor coupled to the input signal and the input mirroring transistor for establishing an output operating current in the cascode connected transistor output stage; and
  a common gate transistor coupled to the diode connected transistor and the common source transistor for isolating the common source transistor from any change in an output voltage present at an output terminal of the common gate transistor while operating to control an output current conducted by the common gate transistor in response to the control bias.

6. The cascode amplifier circuit according to claim 5 wherein the current mirror comprises:
  a diode connected mirror transistor having a bias node coupled to a voltage bias and a diode connected node coupled to a conduction node of the input mirroring transistor, the diode connected mirror transistor operating at the first output current; and
  a current mirroring transistor having a control node coupled to the diode connected node of the diode connected mirror transistor and a conduction node coupled to a diode connected node of the diode connected transistor, the current mirroring transistor operating to conduct the second output current between the voltage bias and the diode connected node of the diode connected transistor at a magnitude determined at least in part by a ratio of effective device geometries between the diode connected mirror transistor and the current mirroring transistor.

7. The cascode amplifier circuit according to claim 6 wherein the ratio of effective device geometries between the diode connected mirror transistor and the current mirroring transistor controls a current gain realized between the first output current and the second output current.

8. The cascode amplifier circuit according to claim 5 wherein the cascode amplifier circuit is part of an active function circuit included in a control circuit for a radio frequency communication device.

9. A radio frequency communication device, comprising:
  a control circuit for managing information communication by the radio frequency communication device, the control circuit comprising:
    at least one active function circuit that implements command and control functions associated with the radio frequency communication device, the at least one active function circuit including at least one cascode amplifier circuit, comprising:
      an input mirroring transistor having a control node coupled to an input signal, the input mirroring transistor generating a first output current in response to the input signal;
      a current mirror coupled to the input mirroring transistor, the current mirror operating to generate a second output current that is proportional to the first output current;
      a diode connected transistor coupled to the current mirror for generating a control bias in response to the second output current and the first output current that is directly coupled from the input mirroring transistor; and
      a cascode connected transistor output stage coupled to the input mirroring transistor and the diode connected transistor, the cascode connected transistor output stage comprising:
        a common source transistor coupled to the input signal and the input mirroring transistor for establishing an output operating current in the cascode connected transistor output stage; and a common gate transistor coupled to the diode connected transistor and the common source transistor for isolating the common source transistor from any change in an output voltage present at an output terminal of the common gate transistor while operating to control an output current conducted by the common gate transistor in response to the control bias.

10. The radio frequency communication device according to claim 9 wherein the current mirror comprises:

a diode connected mirror transistor having a bias node coupled to a voltage bias and a diode connected node coupled to a conduction node of the input mirroring transistor, the diode connected mirror transistor operating at the first output current; and a current mirroring transistor having a control node coupled to the diode connected node of the diode connected mirror transistor and a conduction node coupled to a diode connected node of the diode connected transistor, the current mirroring transistor operating to conduct the second output current between the voltage bias and the diode connected node of the diode connected transistor at a magnitude determined at least in part by a ratio of effective device geometries between the diode connected mirror transistor and the current mirroring transistor.

11. The radio frequency communication device according to claim 10 wherein the ratio of effective device geometries between the diode connected mirror transistor and the current mirroring transistor controls a current gain realized between the first output current and the second output current.

* * * * *